United States Patent
Muehlheim et al.

(10) Patent No.: US 7,564,338 B2
(45) Date of Patent: Jul. 21, 2009

(54) MICROMECHANICAL DEVICE HAVING INTEGRATED HEATING

(75) Inventors: Richard Muehlheim, Tuebingen (DE);
Frank Wehrmann, Reutlingen (DE);
Polichronis Lepidis, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 381 days.

(21) Appl. No.: 11/193,057

(22) Filed: Jul. 28, 2005

(65) Prior Publication Data

US 2006/0289415 A1 Dec. 28, 2006

(30) Foreign Application Priority Data

Jul. 28, 2004 (DE) ......... 10 2004 036 604
Jun. 27, 2005 (DE) ......... 10 2005 029 841

(51) Int. Cl.
*H01C 7/10* (2006.01)
(52) U.S. Cl. .................................. 338/23
(58) Field of Classification Search ............ 338/23
See application file for complete search history.

(56) References Cited

U.S. PATENT DOCUMENTS

| | | | | |
|---|---|---|---|---|
| 4,966,037 A | * | 10/1990 | Sumner et al. | 73/204.26 |
| 5,902,556 A | * | 5/1999 | Van De Vyver et al. | 422/174 |
| 6,860,153 B2 | * | 3/2005 | Leung | 73/708 |
| 6,901,794 B2 | * | 6/2005 | Zobel et al. | 73/204.26 |
| 2001/0025531 A1 | * | 10/2001 | Leung | 73/708 |
| 2002/0190839 A1 | * | 12/2002 | Padmanabhan et al. | 338/13 |
| 2004/0147057 A1 | * | 7/2004 | Benzel et al. | 438/54 |
| 2005/0081621 A1 | * | 4/2005 | Zobel et al. | 73/204.26 |

\* cited by examiner

*Primary Examiner*—Kyung Lee
(74) *Attorney, Agent, or Firm*—Kenyon & Kenyon LLP

(57) ABSTRACT

A micromechanical device having a micromechanical component and a heating element and a method for controlling and/or regulating the heating element. In this context, the heating element is used to bring the micromechanical component, which preferably has electrical components, and/or a passivator surrounding the micromechanical component to a specifiable temperature.

12 Claims, 4 Drawing Sheets

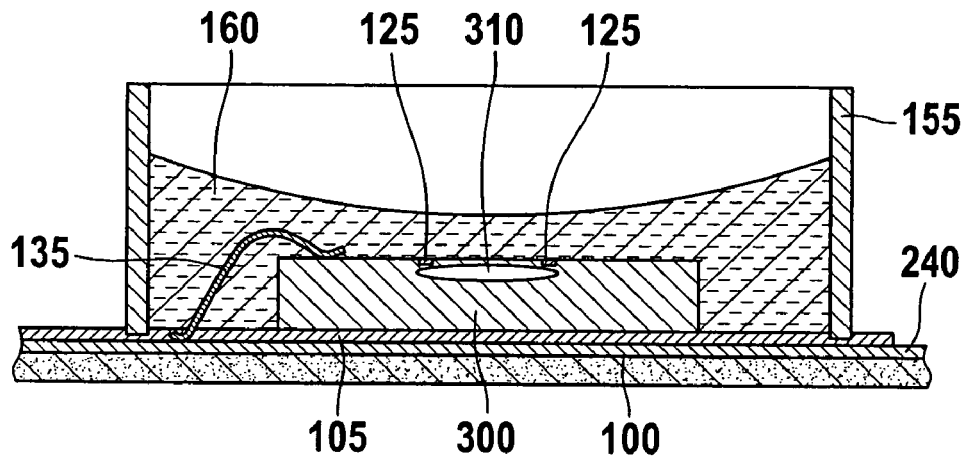
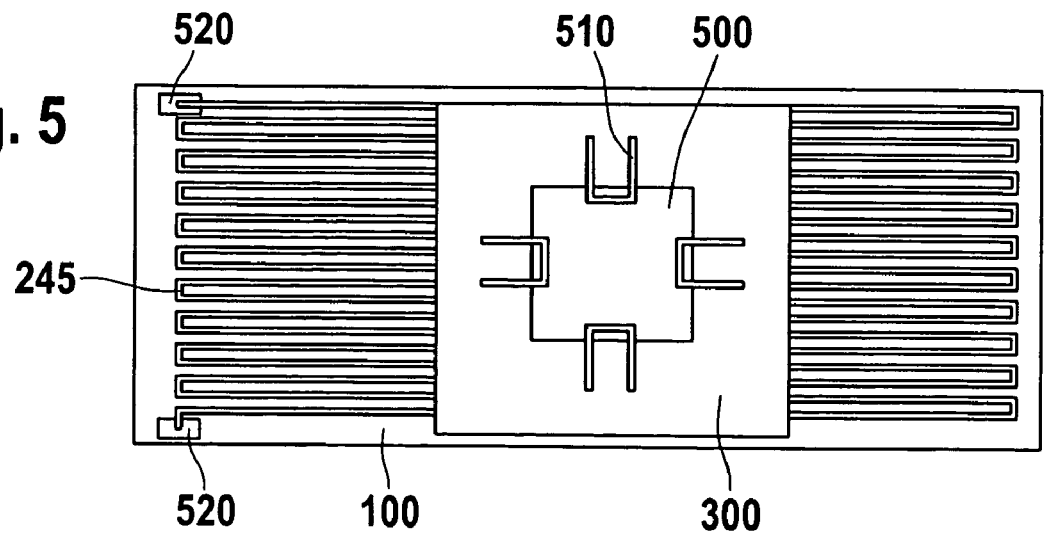

MICROMECHANICAL DEVICE HAVING INTEGRATED HEATING

FIELD OF THE INVENTION

The present invention is based on a micromechanical device having a heating element or on a method for controlling and/or regulating the heating element.

BACKGROUND INFORMATION

Electrical components in micromechanical devices normally include regions that are sensitive with respect to aggressive media. Thus, for example, contact connections such as bonding wires or electrical lines as well as arc gaps or circuits may corrode over time if they are attacked by aggressive media. In electrical components equipped with sensor elements, moreover, the signal acquisition may be impaired if deposits interfere with signal detection. Thus it is conceivable that such deposits alter the stiffness of the diaphragm used in a pressure sensor, as a result of which there is no longer a clear correlation between the pressure and a detected deflection of the diaphragm.

For protection against damaging environmental influences, it is possible to cover the electrical component, the electrical contacts and the sensor element at risk with a special passivating layer. This is done in such a way for example that the sensor element or the (electrical and/or mechanical) components required for detecting and/or evaluating a sensor signal are mounted in a housing and are subsequently covered by a passivator. Usually this passivation is achieved by filling the housing. The filling in this context is used to passivate the sensor element or to protect the components against media such as water, air, gasoline, salt etc. Thus it is possible to prevent sensitive elements of the sensor from corroding. What is problematic about the passivation, however, is the interaction of the passivator and the damaging medium.

Micromechanical pressure sensors, in which for system-related reasons the pressure is supplied from the front side of the sensor chip, are normally protected from environmental influences by a gel such as, for example, a fluorine silicon gel. This gel covers the surface of the chip and the bonding wires and prevents corrosive media from coming into contact with the chip. When selecting the gel, however, one must be mindful of the fact that the gel transmits the pressure of the medium for detecting a pressure variable to the pressure sensor diaphragm in the sensor chip.

For the application of pressure sensors in a highly corrosive environment, as can normally be found in the exhaust branch of a motor vehicle, even the best of the currently available gels cannot prevent corrosive ingredients of the medium from diffusing through the gel over time and resulting in a corrosion of the sensor element or of other components on the sensor chip.

An expensive structural variant for protecting the pressure sensor is to install the sensor element made up of a sensor chip and bonding wires in a chamber filled with silicon oil, which maintains contact with the environment via a steel diaphragm. A change of the ambient pressure is transmitted via the steel diaphragm directly to the silicon oil and thus to the sensor element or the sensor chip.

Non-prepublished German Application No. 102004006212 describes the use of electrical components in corrosive environments by introducing an additional layer of material into the passivator. This additional material layer reduces or completely compensates the diffusion of the corrosive components of the medium.

SUMMARY OF THE INVENTION

The present invention describes a micromechanical device having a micromechanical component and a heating element and a method for controlling and/or regulating the heating element. In this context, the heating element is used to bring the micromechanical component, which preferably has electrical components, and/or a passivator surrounding the micromechanical component to a specifiable temperature.

This allows for a simplified application of temperature in the adjustment or in the final measurement of the micromechanical component. In addition, an improvement may be achieved in the resistance to media on the part of the electrical components on or in the micromechanical component.

In a refinement of the present invention, the micromechanical device may be used in aggressive media. For protecting the electrical components, a provision is made to cover them at least partially with a passivator. To this end, a provision is made for the heating element to be triggered as a function of a temperature variable representing the temperature of the passivator. Advantageously, this increases the operational life of the electrical component in the aggressive medium.

Moreover, a means for detecting the ambient temperature may be provided, it being possible to derive the temperature of the passivator from the ambient temperature.

A special further development of the present invention provides for the heating element to heat the passivator such that it has a temperature above the ambient temperature. There may be a provision in particular to heat the component above 0° C. This has the advantage of being able to prevent the critical elements of the sensor device from icing up.

A refinement of the present invention provides for the electrical component to have at least one sensor element, one electrical contacting element, one electrical adjusting element and/or one evaluation circuit. In this context, a special variant may provide for the sensor element to be suitable for detecting a state variable of a medium, particularly for detecting a pressure variable. Furthermore, the passivator may be provided to cover at least a part of the sensor element, the electrical contacting element, the electrical adjusting element and/or the evaluation circuit and thus protect them against a direct attack by the aggressive medium.

It is advantageously provided for the micromechanical device to have a temperature sensor and/or a circuit suitable for this purpose. Thus the temperature sensor may be accommodated in immediate proximity to the sensor element and/or in the passivator itself. There may also be a provision, however, for the temperature sensor to detect the ambient temperature of the micromechanical device. In this case, the temperature sensor is suitably attached outside of the passivator, for example to the housing of the micromechanical device. Furthermore, there may be a provision for a part of the evaluation circuit to be usable for detecting the temperature variable.

A further development of the present invention provides for the sensor element to be equipped with a diaphragm and at least one in particular piezoelectric resistor. For this purpose, the sensor element is indirectly or directly mounted on a support, for example a printed circuit board or a ceramic support (hybrid). The sensor element is optionally connected to an external trigger circuit or evaluation circuit, for example via a bond.

In a refinement of the present invention, the heating element may be attached directly to the electrical component. Advantageously, the heating element, however, is in direct contact with the passivator so as to allow for a good heat transfer. Thus there may be a provision for the heating element to be mounted on the sensor element, e.g. on the diaphragm, or between the sensor element and the support element for the electrical component.

Advantageously, the micromechanical device is accommodated in a housing containing the electrical component as well as the passivator. For this purpose, the heating element may be fastened directly to the housing. In a particular refinement of the present invention, the heating element is integrated into the housing such that both elements form a structural unit.

The electrical component and the heating element are advantageously mounted on a support element. For this purpose, the heating element may be fastened on the same side as the electrical component or also on the opposite side of the support element. In a refinement of the present invention, the heating element takes the form of a meander-shaped (resistor) structure.

Furthermore, a method is provided for controlling and/or regulating the heating power of a heating element in a micromechanical device of the type described. To this end, the device is provided to have at least one electrical component and one passivator. According to the present invention, in this method the heating power is controlled and/or regulated at least as a function of a temperature variable representing the temperature of the passivator. Advantageously, this temperature variable may result from the detection of the ambient temperature of the micromechanical device and may be taken into consideration for controlling and/or regulating the heating power. A special refinement of the present invention provides for the heating power of the heating element to be controlled for adjusting the electrical component. In addition, it is possible to infer a break of the resistor structure and possibly a break of the diaphragm below from the measurement of the resistance of the heating element.

BRIEF DESCRIPTION OF THE DRAWINGS

FIGS. 2, 4 and 6 show different possibilities for placing the heating element in the construction of a pressure sensor.

FIGS. 5, 7 and 8 show possible arrangements of a meander-shaped heating structure.

DETAILED DESCRIPTION

In the following exemplary embodiment, the use of a heating element according to the present invention for reducing or preventing the diffusion of aggressive media into a passivator is to be described In the process, the use of the present invention is described with reference to a pressure sensor, it being provided to use the present invention also in other electrical components that are manufactured in a micromechanical method of construction and that have corrosion-sensitive regions. Aside from other sensors such as air mass sensors or temperature sensors, semiconductor circuits, which are used for example for evaluation and/or adjustment purposes, are conceivable as well.

Figure 1:
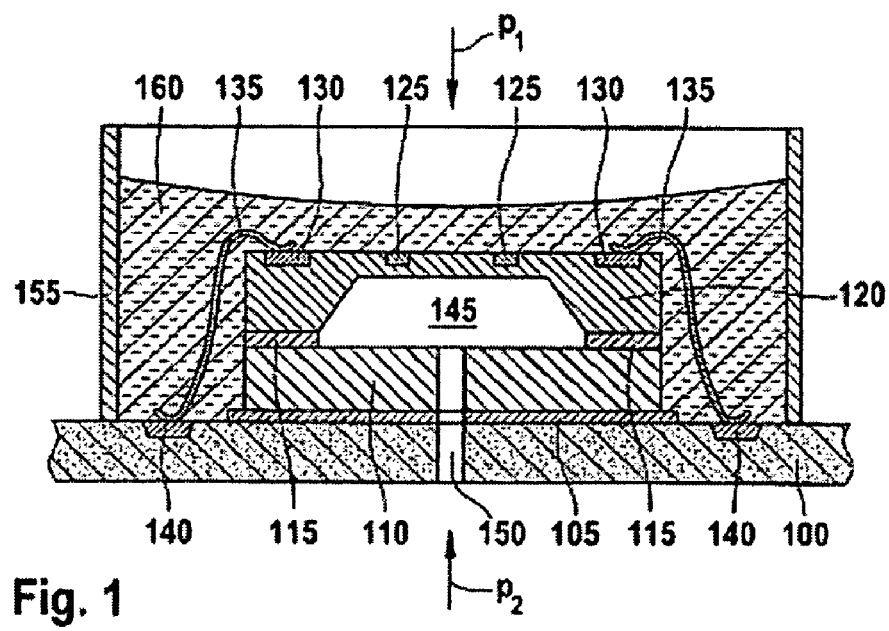
FIGS. 1 and 3 show pressure sensors according to the related art.

FIG. 1 shows a known structure of a micromechanical pressure sensor in a housing. In this instance, a micromechanical sensor element 120 having piezoelectric resistors 125 is connected to a substrate 110 by suitable connecting materials 115. In the conventionally used connection technique of anodic bonding, the connecting layer may also be omitted. The electrical component thus produced having sensor element 120 is subsequently mounted on a support element 100, for example a ceramic support or a (hybrid) printed circuit board, with the aid of a suitable connecting layer 105. Generally, it should be assumed, however, that the sensor element of the pressure sensor can also be realized by another construction. Common materials for the micromechanical sensor element are moreover semiconductor materials, glass or steels. Sensor element 120 may be equipped for example with a diaphragm and a cavity 145 lying beneath the diaphragm having a specified pressure $p_2$. For example, if substrate 110 does not have an access hole 150 below the cavity and a vacuum is enclosed in the bonding of the substrate and sensor element. For differential pressure applications, however, substrate 110 and support element 100 may also be provided with a duct 150 to cavity 145 or to the diaphragm such that pressure $p_2$ in cavity 145 may be varied.

Between pressure $p_2$ in cavity 145 and the ambient pressure $p_1$ of the sensor there is thus a pressure difference. A variation in the ambient pressure is thus expressed in a movement of the diaphragm. With the aid of suitable electrical components such as for example piezoelectric resistors 125 shown on the diaphragm, this movement can be converted into a measured variable that is generated proportionally with respect to the prevailing pressure difference. For transmitting this measured variable, connecting elements such as bonding wires 135 for example are provided, which are routed from sensor chip 120 for example to support element 100 for the further evaluation of the measured variable. Usually, these bonding wires 130 are fastened to sensor chip 120 and/or to support element 100 with the aid of bonding pads. It is also conceivable, however, to provide contacting surfaces 130 or 140 on sensor chip 120 and/or on support element 100, which allow for a control of sensor chip 120 and/or an evaluation, amplification or transmission of the measured variable by external control means. In addition, integrated circuits may also be provided directly on sensor element 120 itself for conditioning the signal, i.e. for amplification, linearization and/or evaluation. To protect the sensor element against damage, the sensor element is accommodated in a housing 155. To this end, as shown in FIG. 1, housing 155 may be made up merely of housing walls 155 or also of housing walls including a housing cover. Since contacting areas 130 and 140 of bonding wires 135 and/or other electrical components of the sensor element (printed circuit boards, circuits etc.) represent corrosion-sensitive regions, which can be attacked by aggressive media, a provision is made to fill the interior of housing 155 at least partially with a passivator 160, for example a gel. When selecting passivator 160, care must be taken to ensure that all corrosion-sensitive regions are sufficiently covered so that they are protected against the possibly corrosive medium. In addition, passivator 160 must be selected in such a way that on the one hand it is sufficiently soft so as not to cause mechanical strains on the sensor diaphragm, but that on the other hand it also transmits the ambient air pressure directly to the diaphragm.

The pressure to be measured is conveyed by conveying the pressure-conveying medium to the pressure sensor. In many areas of application such as e.g. in automotive engineering, plant engineering etc., chemically aggressive media are used. As already mentioned, the sensor in such applications is usually protected against these aggressive media by special measures, e.g. the use of passivating gels. In certain applications, this protection is not sufficient, however, since the media may pass through the passivating layers e.g. by diffusion processes. Now in these cases there is the danger, particularly in the circuit elements or sensor elements of the pressure sensor, that aggressive media on the pressure sensor result in corrosion and thus in the destruction of the sensor. Typical areas in which corrosion may occur are the integrated evaluation circuits in the pressure sensor, the bonding lands of the bonding wires as well as regions that are required for the adjustment of the sensor such as arc gaps for example.

While some of the listed regions may be protected against media influences by a stable passivating layer made of e.g. silicon nitride, other regions such as the arc gap or bonding pads can only be protected against the aggressive media by a more variable additional passivation e.g. by a passivating gel. On the whole, however, in the case of all passivating materials there is the danger that the aggressive constituents pass through the passivating layers by diffusion processes in the course of the sensor operation and reach the susceptible regions. With the aid of integrated heating in the pressure sensor, the diffusion gradient can be changed in such a way that aggressive media are prevented from passing through the passivation. Furthermore, integrated heating may be used to prevent condensation of aggressive media on the sensor surface and/or passivation surface such that the accumulation of harmful concentrations of aggressive media for example on the diaphragm surface is prevented.

Figure 2:
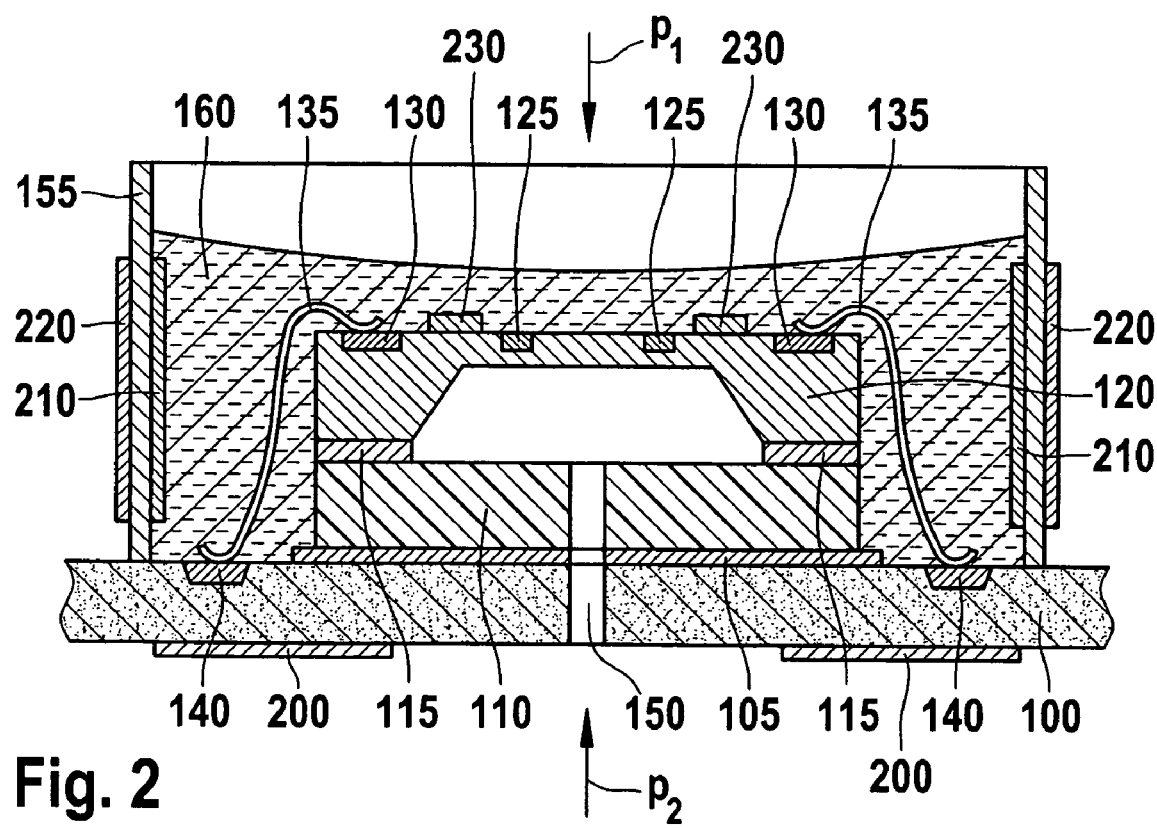

This kind of integrated heating may be implemented by heating elements as shown in FIG. 2. Thus heating elements 210 and 230 may be provided which have a direct contact with passivator 160, whereas heating elements 200 and 220 only heat the pressure sensor or passivator 160 indirectly. Concretely, heating elements 210 or 220 may be attached to housing 155, it also being conceivable for the heating elements to be integrated directly into the housing wall. Using a heating element 200, as indicated in FIG. 2 below support element 100, makes it possible to achieve a planar heating of the support element and thus of passivator 160. There may be an additional provision, however, for at least one heating element to be mounted on support element 100 next to the printed circuit traces for the electrical power supply of the pressure sensor. Using heating elements 230, which may be mounted near or on sensor element 120, the passivator may be heated in the endangered regions. It is also conceivable, however, for the heating element to be embedded directly into the passivating material (not shown).

The at least one heating element provided may also be produced for example like the piezoelectric resistors on the pressure sensor by a pressure process. A production of the heating element using micromechanical manufacturing processes is also conceivable, as is possible for example in the manufacture of an air mass sensor. Furthermore, it is also possible to glue the component on additionally as a component or to integrate it into the pressure sensor IC.

In order to control or regulate the heating power at which the heating element is operated, means may be provided for measuring the temperature of passivator 160 which measure a temperature variable. These may be temperature sensors, for example, which have a direct contact to passivator 160. In this connection it is conceivable that such temperature sensors are embedded into passivator 160 itself or are mounted on sensor element 120. To this end, a temperature sensor used for detecting the sensor signal may be used as well. Moreover, however, it is also possible that the temperature sensor is attached to the housing, to the substrate or to the support element and possibly measures the temperature of the passivator only indirectly. Another possibility for measuring the temperature of the passivator is to infer the temperature of the passivating agent from the triggering of sensor element 120.

By measuring the temperature of the passivator it is possible specifically to adjust the heating power of the heating element and thus the diffusion gradient. In a possible control variant, the temperature of the passivator is selected in such a way that it lies above the ambient temperature of the pressure sensor. For this purpose, however, a temperature sensor is required for measuring the ambient temperature. Optionally, a temperature sensor in the passivator may be omitted in this instance since the temperature of the passivating agent and the ambient temperature stand in a certain relation of dependence. This dependence, which is produced by the temperature radiation of the passivator or the heating of the passivator by the surrounding medium, may be taken into account in the triggering of the heating element.

In addition to reducing the rate of diffusion of the aggressive media by heating passivator 160, in a further exemplary embodiment, control of the heating power of the heating element may also be achieved in that less corroding material is deposited on the surface of the passivator or on the uncovered regions of the pressure sensor. For this purpose, the ambient temperature of the pressure sensor may be used for example to control or regulate the heating power.

Figure 3:
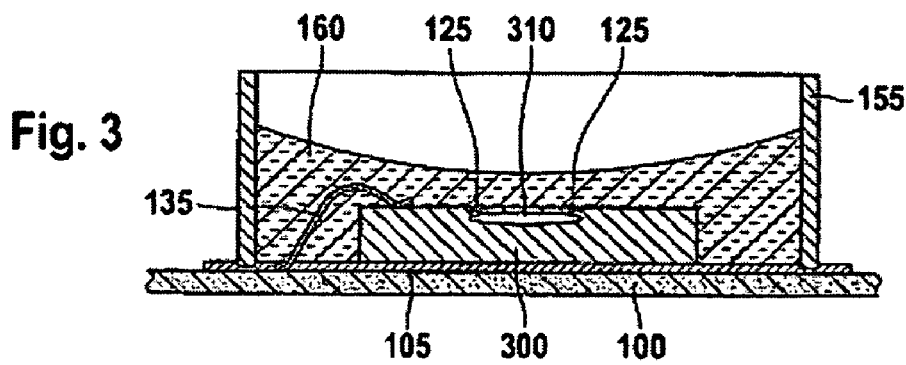

As an alternative to the pressure sensor element already shown, the diaphragm and the cavity may also be manufactured by producing porous silicon. FIG. 3 shows a common refinement. In this instance, as already shown by FIG. 1, sensor element 300 or the sensor chip having an appropriate (evaluation) circuit is mounted on a support element 100 using an adhesive or soldering material 105. Piezoelectric resistors 125 are provided above the cavity 310 created from the porous silicon. Piezoelectric resistors 125 or the evaluation circuit (not shown) situated on the chip are electrically connected via a bond 135. For protecting electrical contacts and connections, a passivating layer 160 is deposited on sensor element 300 preferably in a housing 155 or a gel ring. So as also to protect bonding wires 135 effectively, the elevation of passivator 160 must reach at least the elevation of the bond.

FIG. 4 shows in an exemplary fashion another arrangement of a heating element 240 in relation to a sensor element 300. In this instance, heating element 240 is integrated into support element 100 (e.g. ceramic) before sensor element 300 is fixed on support element 100 using adhesive or soldering material 105. Generally, the various positions of heating elements 200, 210, 220, 230 and 240 as well as the refinements of the heating elements still to be presented are to be usable for all applications.

Figure 6:
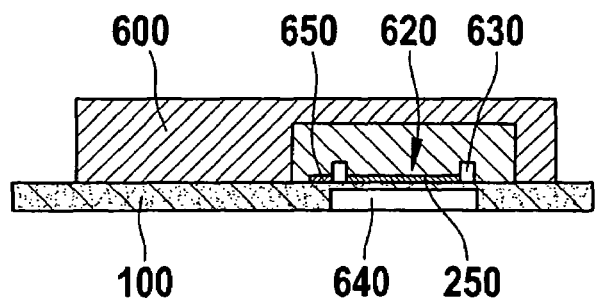

A special refinement of a pressure sensor 650 in flip-chip technology having electrical contacting in which the heating element is mounted directly on the sensing element is shown in FIG. 6. In this instance, sensor element 600 is mounted on support element 100 in such a way that the medium has no direct access to diaphragm 620. Rather, with the aid of a recess 640 in support element 100, a deflection of the support element is achieved, which in turn acts on diaphragm 620. Required for this purpose, however, are decoupling cavities 630, which may also be manufactured from porous silicon for example. In order to produce the temperature changes already described, heating element 250 may be accommodated between diaphragm 620 and the thinned support element in recess 640.

In an exemplary manner, heating elements 200 through 240 may be provided as resistance surface, which may be connected electrically using a special contacting. FIG. 5 shows a possible refinement of a meander-shaped electrical heating element 245 in a support plate 100 having contacting points 520. Thus sensor chip 300 along with diaphragm 500 and piezoelectric resistors 510 are situated above heating element 245 such that there is no direct contact between heating element 245 and the diaphragm or the resistors picking up the measured values.

Figure 7:
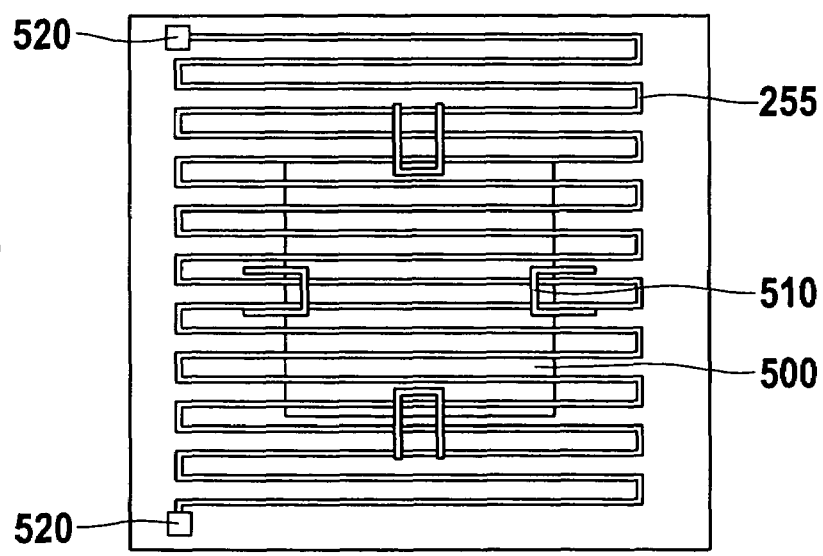
Figure 8:
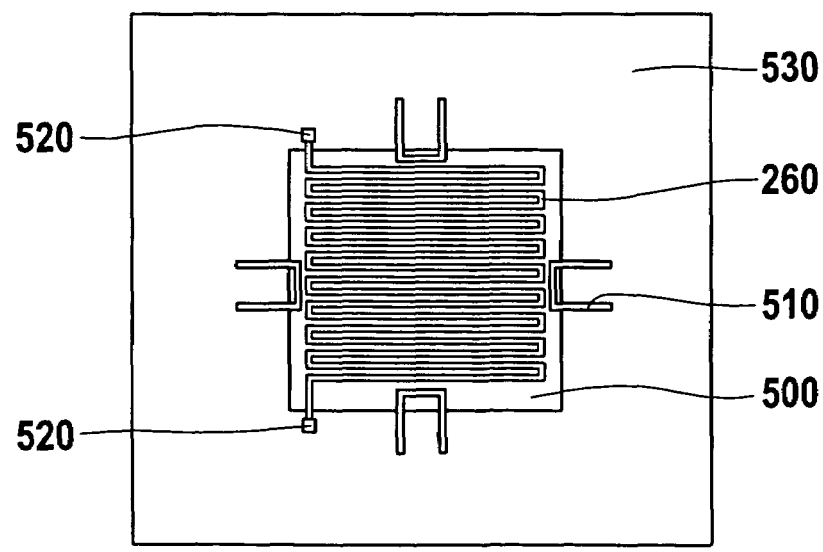

FIG. 7 shows another refinement in which the meander-shaped resistor structure 255 is mounted on the surface of a sensor chip. In this instance, not only diaphragm 500 but also the surface around the diaphragm is covered by the heating structure. It is also possible, however, to deposit resistor structure 260 only on diaphragm 500, as shown in FIG. 8. Thus surface 530 surrounding the diaphragm would be available for mounting an evaluation electronics.

Depending on their positioning, the heating elements may be diffused or metallized in the surface of support element 100, sensor element 120 or 300 or of housing 155. For this purpose, it is possible to provide either the entire chip surface of the sensor element as in FIG. 7 or only diaphragm 500 as in FIG. 8 with a heating layer. This allows for a temperature application in the adjustment of the sensor element such that the effort and costs of the adjustment can be significantly reduced.

Resistance meanders in the diaphragm allow for a measurement of temperature in addition to an application of temperature. In addition, the detection of tears in the diaphragm is possible as well. Thus, if the meander structure is designed to be suitably thin, the heating element can also be interrupted in the event of a tear in the diaphragm. From a feedback of the interruption it is thus possible to infer a tear in the diaphragm. This type of tear detection can be advantageous particularly in applications that are critical with respect to safety.

The heatability can furthermore be used to prevent a formation of ice in the sensor region or on the diaphragm in the case of ambient temperatures of the sensor or of the sensor element of below 0° C. In addition, if an excess temperature is set in relation to the ambient temperature, a condensation of water in critical regions of the sensor element, for example on the diaphragm, may be prevented. A special exemplary embodiment may provide for general heating in the control of the heating power of the heating element in a pressure sensor, irrespective of a measurable temperature variable. In this case, therefore, the measurement of an additional temperature variable is not necessary.

Another possibility of implementing a heating of the sensor element or of the sensor chip is the use of transistors or thyristors, which can be used to control or regulate the temperature actively.

Generally, it is important to have a uniform temperature distribution on the sensor chip to produce the effects described. This may be achieved by optimizing the arrangement of the heating elements on the chip. The use of several heating elements lying side-by-side or interlocking is conceivable for this purpose. Moreover, in combination with a temperature sensor, it is possible to control the temperature very rapidly.

Heat is dissipated via the chip attachment (e.g. adhesive, solder) and via the passivator (e.g. gel). If the adhesive and the gel are made of heat-insulating materials, then it is additionally possible to minimize the heating power. A suitable heat insulation may also be achieved by using a thick adhesive layer.

What is claimed is:

1. A micromechanical device, comprising:
   a micromechanical component;
   a passivator surrounding the micromechanical component; and
   a heating element, wherein:
      a temperature of at least one of the micromechanical component and the passivator can be at least one of controlled and regulated in a specifiable manner using the heating element.

2. The micromechanical device as recited in claim 1, wherein:
   the micromechanical component is at least partially covered by the passivator, and
   the heating element is triggered as a function of a temperature variable representing the temperature of the passivator.

3. The micromechanical device as recited in claim 2, wherein:
   in order to measure the temperature variable at least one of a temperature sensor and an electrical circuit is provided,
   the temperature sensor is provided at least one of in immediate proximity to the sensor element, in the passivator itself, and outside of the passivator, and
   the electrical circuit for measuring the temperature variable is part of the evaluation circuit.

4. The micromechanical device as recited in claim 1, wherein:
   the at least one of the micromechanical component and the passivator is heated above a temperature of a medium surrounding the micromechanical device.

5. The micromechanical device as recited in claim 1, further comprising:
   an arrangement for measuring an ambient temperature of the micromechanical device, the temperature of the passivator being derivable from the ambient temperature.

6. The micromechanical device as recited in claim 1, wherein:
   the micromechanical component includes an electrical component that includes at least one of a sensor element for measuring a pressure variable, an electrical contacting element, an electrical adjusting element, and an evaluation circuit, and
   the passivator covers at least one of the sensor element, the electrical contacting element, the electrical adjusting element, and the evaluation circuit.

7. The micromechanical device as recited in claim 6, further comprising:
   a support including a printed circuit board, wherein:
      the sensor element includes a diaphragm having at least one piezoelectric resistor,
      the sensor element is mounted on the support, and
      the electrical component includes a bond for contacting the sensor element and an external trigger circuit.

8. The micromechanical device as recited in claim 6, further comprising:
   a housing for the electrical component and the passivator, wherein:
      the heating element is mounted to the housing, and
      the heating element and the housing form a unit.

9. The micromechanical device as recited in claim 6, further comprising:
   a support element including a printed circuit board, wherein:
      the electrical component is mounted on the support element,
      the heating element is mounted on the support element,
      the heating element is mounted on a side of the support element opposite from the electrical component.

10. The micromechanical device as recited in claim 1, wherein:
    the heating element is at least one of mounted to the electrical component and in direct contact with the passivator,
    the heating element is mounted one of on the sensor element and between the sensor element and a support element for the electrical component.

11. The micromechanical device as recited in claim 1, further comprising:

a diaphragm situated on the micromechanical component, wherein:
    the heating element covers one of a side of the micromechanical component and a diaphragm situated on the micromechanical component.

12. The micromechanical device as recited in claim 1, wherein the heating element is designed in a meander form.

* * * * *